US008433529B2

(12) United States Patent
Nakano et al.

(10) Patent No.: US 8,433,529 B2
(45) Date of Patent: Apr. 30, 2013

(54) WATT-HOUR METER

(75) Inventors: Kenji Nakano, Kodaira (JP); Yoshito Sameda, Yokohama (JP); Yukio Takanohashi, Hachioji (JP); Tadanori Maoka, Fujisawa (JP); Mitsuhiro Sakoyama, Yokohama (JP); Fuyuki Kurokawa, Yokohama (JP)

(73) Assignee: Toshiba Toko Meter Systems Co., Ltd., Tokyo (JP)

( * ) Notice: Subject to any disclaimer, the term of this patent is extended or adjusted under 35 U.S.C. 154(b) by 799 days.

(21) Appl. No.: 12/392,315

(22) Filed: Feb. 25, 2009

(65) Prior Publication Data

US 2009/0248330 A1   Oct. 1, 2009

(30) Foreign Application Priority Data

Feb. 28, 2008  (JP) ................................ 2008-048645

(51) Int. Cl.
*G01R 21/06* (2006.01)
(52) U.S. Cl.
USPC .................... 702/61; 702/57; 702/60; 702/64
(58) Field of Classification Search .................. 702/57, 702/60–66, 69, 72, 90, 117, 182–184, 189
See application file for complete search history.

(56) References Cited

U.S. PATENT DOCUMENTS

| | | | | |
|---|---|---|---|---|
| 3,893,072 A | * | 7/1975 | D'Antonio et al. | 714/751 |
| 4,255,707 A | * | 3/1981 | Miller | 324/142 |
| 4,504,831 A | * | 3/1985 | Jahr et al. | 340/870.03 |
| 4,752,731 A | * | 6/1988 | Toda | 324/142 |
| 5,430,739 A | * | 7/1995 | Wei et al. | 714/784 |
| 5,994,892 A | * | 11/1999 | Turino et al. | 324/142 |
| 6,411,219 B1 | * | 6/2002 | Slater | 340/870.02 |
| 7,583,202 B2 | * | 9/2009 | Robinson et al. | 340/870.02 |
| 2004/0125889 A1 | * | 7/2004 | Cumeralto et al. | 375/303 |
| 2009/0228224 A1 | * | 9/2009 | Spanier et al. | 702/60 |

FOREIGN PATENT DOCUMENTS

JP   P2004-226094   8/2004

OTHER PUBLICATIONS

Wicker, S. and Bhargava, V., Reed-Solomon Codes and Their Applications,1994, IEEE Press Marketing, IEEE Order No. PP3749, ISBM 0-07803-5319-9, Chapter 1, pp. 1-16.*
U.S. Appl. No. 12/274,693, filed Nov. 20, 2008, Yukio Takanohashi, et al.

* cited by examiner

*Primary Examiner* — Mischita Henson
(74) *Attorney, Agent, or Firm* — Oblon, Spivak, McClelland, Maier & Neustadt, L.L.P.

(57) ABSTRACT

In a watt-hour meter, encoders 116, 117, 118 and 119 respectively convert a signal concerning a current and voltage used by a customer into a code sequence signal by Reed-Solomon codes or convolutional codes. Decoders 121, 122, 123, and 124 reversely convert the code sequence signal to the signal concerning the current and voltage. A power calculating section 125 converts the signal concerning the current and voltage into data concerning electricity consumption.

10 Claims, 5 Drawing Sheets

WATT-HOUR METER

CROSS REFERENCE TO RELATED APPLICATION

This application is based upon and claims the benefit of priority from Japanese Patent Application No. 2008-048645 filed on Feb. 28, 2008, the entire contents of which are incorporated herein by reference.

BACKGROUND OF THE INVENTION

1. Field of the Invention

The present invention relates to a watt-hour meter configured to measure electricity consumption in loads and the like.

2. Description of the Related Art

A watt-hour meter has been widely used to measure electricity consumption in homes, business offices or factories. Japanese Patent Application Laid-open Publication 2004-226094 discloses a watt-hour meter having: a detector configured to measure electricity consumption by loads; a controller configured to edit data detected by the detector into a measurement value; a display configured to show the measurement value edited by the controller. In several cases, the data communication between the detector and the controller may be performed by wireless communication or the like.

SUMMARY OF THE INVENTION

In the conventional watt-hour meter as described above, data concerning the electricity consumption in loads may be destroyed by an external disturbance when the data is sent from the detector to the controller. Especially, in a case where the detector and the controller are separately constituted as deferent apparatus in deferent places, the data communication therebetween is performed by optical communication such as infrared communication, radio communication used by weak electric wave, acoustic communication, communication by magnetic signal, or the like. However, a signal concerning the data as described above may often be destroyed by the external disturbance such as surge voltage, intense electric field, or the like. Further, improper signals may be made by a person who intends to illegally use the electric power. Consequently, the improper signals intentionally interfere the watt-hour meter, and the date may be destroyed by the interference.

The conventional watt-hour meter does not have a device in the controller, the device recovering the data received from the detector. Therefore, there is a problem in that the measurement value includes unnecessary error when the external noise is mixed into the signal as described above.

The present invention has been made for solving the above-described problems. An object of the present invention is to provide a watt-hour meter capable of reducing errors in measurement values by recovering the signal concerning the data sent to the controller from the detector when an external noise or an unexpected signal is mixed into the signal concerning the data.

An aspect of the present invention is a watt-hour meter comprising: a detector configured to detect a current flowing to a load and to detect a voltage applied in the load; a digitizing section configured to convert the detected current and voltage into numeric data thereof as a information sequence signal; an encoder configured to convert the information sequence signal into a code sequence signal including an error correction code; a decoder configured to reversely convert the code sequence signal into the information sequence signal with correction and detection of an error in the code sequence signal; and a power calculating section configured to calculate a data concerning an electricity consumption from the information sequence signal reversely converted by the decoder.

According to the present invention, it is possible to provide a watt-hour meter capable of reducing errors in measurement values by recovering the signal concerning the data sent from the detector to the controller if an external noise or an unexpected signal is mixed into the signal concerning the data.

DESCRIPTION OF THE EMBODIMENTS

Embodiments according to the present invention are explained hereinafter.

First Embodiment

Figure 1:
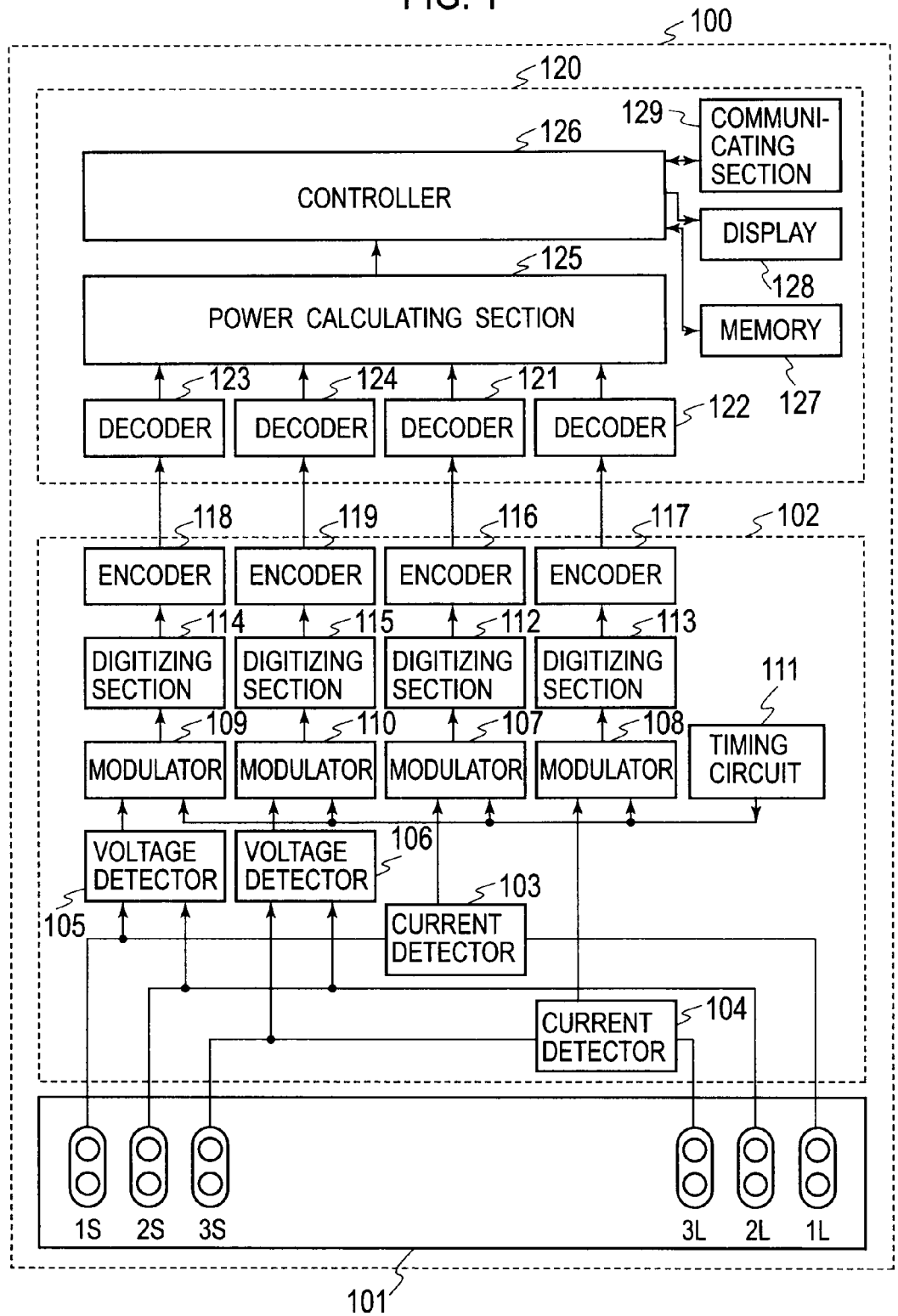
FIG. 1 is a block diagram of a watt-hour meter according to a first embodiment of the present invention.

A first embodiment of the present invention is explained with reference to FIG. 1. A watt-hour meter according to the first embodiment is used in single-phase three-wire system. As shown in FIG. 1, the watt-hour meter main unit 100 of the watt-hour mater has a terminal section 101, a current-voltage measurement section 102 and a processing section 120.

The terminal section 101 has terminals 1S, 2S, 3S, 1L, 2L, and 3L connecting to distribution lines (not shown). The terminals 1S, 2S and 3S connect to the distribution lines receiving electric power from electric supply facilities. The terminals 1L, 2L and 3L connect to the distribution lines supplying the electric power to home or the like. In the terminal section 101, conductive portions (not shown) are mounted to a fastening portion (not shown). The conductive portions are made of metal such as brass, copper or the like. The fastening portion is mainly made of material having good insulation property such as phenol resin, PBT resin (polybutylene terephthalate) or the like.

The current-voltage measurement section 102 has: current detectors 103, 104; voltage detectors 105, 106; modulators 107, 108, 109, 110; digitizing sections 112, 113, 114, 115; and encoders 116, 117, 118, 119. The current-voltage measurement section 102 measures current and voltage consumed by the customer, and outputs signals concerning the measured current and voltage. The detailed configuration is described as follows.

The current detectors 103, 104 respectively include a current transformer, a Hall element, a shunt resistor or the like, which detects a current, converts to a low-level voltage signal with amplitude directly proportional to the detected current, and outputs the low-level signal. The current detector 103 detects a current (referred as a 1-side current A1, hereinafter) flowing between the terminal 1S and the terminal 1L. The current detector 104 detects a current (referred as a 3-side current A3, hereinafter) flowing between the terminal 3S and the terminal 3L.

The voltage detectors 105, 106 respectively include a voltage transformer, a voltage divider such as attenuator, or the like, which detects a voltage, converts to a low-level voltage signal with amplitude directly proportional to the detected voltage, and outputs the low-level signal. The voltage detector 105 detects a voltage (referred as a 1-side voltage V1, hereinafter) between the terminal 1S and the terminal 2S. The voltage detector 106 detects a voltage (referred as a third voltage V3, hereinafter) between the terminal 3S and the terminal 2S.

The modulators 107, 108 respectively include an analog-to-digital converter or the like, which modulates the detected current (i.e. the 1-side current A1 or 3-side current A3) by the current detectors 103 and 104, and outputs the modulated current as digital data. The analog-to-digital converter is a 1-bit analog-to-digital converter, for example. The modulator 107 modulates the 1-side current, and outputs the modulated current as digital data (e.g. 1-bit digital data). The modulator 108 modulates the 3-side current, and outputs the modulated current as digital data (e.g. 1-bit digital data).

The modulators 109, 110 respectively include an analog-to-digital converter or the like, which modulates the detected voltage (i.e. the 1-side voltage V1 and 3-side voltage V3) by the voltage detectors 105 and 106, and outputs the modulated voltage as digital data. The analog-to-digital converter is a 1-bit analog-to-digital converter, for example. The modulator 109 modulates the 1-side voltage, and outputs the modulated voltage as digital data (e.g. 1-bit digital data). The modulator 110 modulates the 3-side voltage, and outputs the modulated voltage as digital data (e.g. 1-bit digital data).

The timing circuit 111 includes a counter and the like, and outputs pulse signals (timing signals) to the modulators 107, 108, 109 and 110 at predetermined periods (e.g. every 1 micro seconds). The start timings of the modulation in the modulators 107, 108, 109 and 110 are determined by the pulse signals.

Hereinafter, the detailed configurations of the modulators 107, 108, 109 and 110 using the 1-bit analog-to-digital converter are explained.

Figure 2:
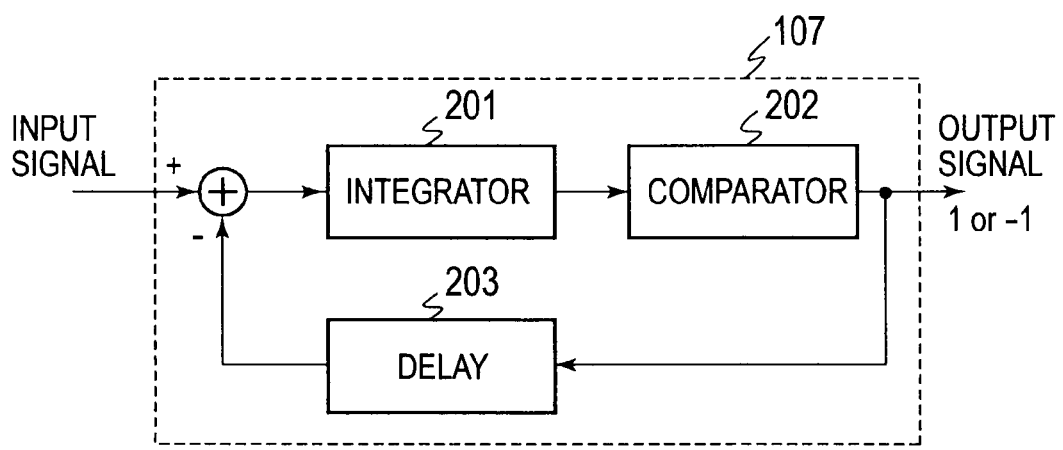
FIG. 2 is a block diagram showing a delta-sigma modulator.

FIG. 2 shows a delta-sigma modulator as the modulator 107, the delta-sigma modulator being an example of the 1-bit analog-to-digital converter. The delta-sigma modulator includes an integrator 201, a comparator 202 and a delay circuit (a sample and hold circuit) 203. The delta-sigma modulator outputs a high-level signal (corresponding to "+1") or low-level signal (corresponding to "−1") by comparing an input signal with a predetermined threshold value. The modulators 108, 109 and 110 also have the same configuration of the modulator 107.

Figure 3:
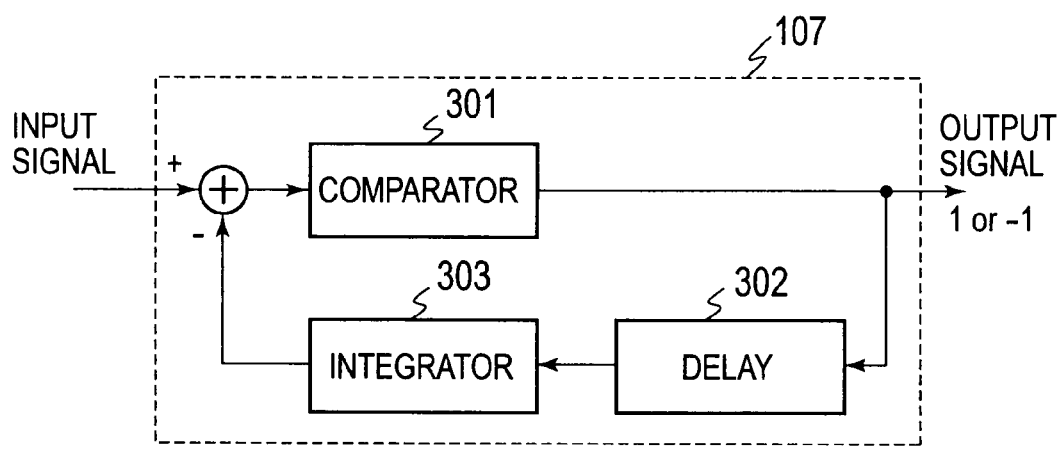
FIG. 3 is a block diagram showing a delta modulator.

FIG. 3 shows a delta modulator as the modulator 107, the delta modulator being another example of the 1-bit analog-to-digital converter. The delta modulator includes a comparator 301, a delay circuit (a sample and hold circuit) 302 and an integrator 303. The delta modulator outputs a high-level signal (corresponding to "+1") or low-level signal (corresponding to "−1") by comparing an input signal with a predetermined threshold value. The modulators 108, 109 and 110 also have the same configuration of the modulator 107.

As further another configuration of the modulators 107, 108, 109 and 110, they may be composed of a pulse-width modulation circuit (not shown).

The digitizing sections 112, 113, 114, and 115 respectively include a counter circuit, which produces digital data with multiple bits (e.g. 16-bit digital data) as information sequence signals, based on the digital data (e.g. 1-bit digital data) output from the modulators 107, 108, 109 and 110. The digitizing section 112 produces digital data concerning the 1-side current A1 based on the digital data output from the modulator 107. The digitizing section 113 produces digital data concerning the 3-side current A3 based on the digital data output from the modulator 108. The digitizing section 114 produces digital data concerning the 1-side voltage V1 based on the digital data output from the modulator 109. The digitizing section 115 produces digital data concerning the 3-side voltage V3 based on the digital data output from the modulator 110.

The encoders 116, 117, 118 and 119 respectively convert the digital data output from the digitizing sections 112, 113, 114, and 115 into Reed-Solomon codes or convolutional codes used in Viterbi decoding or the like. The encoder 116 converts the information sequence signal, which concerns the 1-side current A1 and is output from the digitizing section 112, into code sequence signal. The encoder 117 converts the information sequence signal, which concerns the 3-side current A3 and is output from the digitizing section 113, into code sequence signal. The encoder 118 converts the information sequence signal, which concerns the 1-side voltage V1 and is output from the digitizing section 114, into code sequence signal. The encoder 119 converts the information sequence signal, which concerns the 3-side voltage V3 and is output from the digitizing section 115, into code sequence signal.

The processing section 120 calculates consumption data of a customer, and outputs the consumption data by displaying or the like. Here, the consumption data means data concerning electricity consumption by the customer such as electricity consumption in different hours, total electricity consumption in loads, and the like.

The processing section 120 has: decoders 121, 122, 123 and 124; a power calculating section 125; a controller 126; a memory 127; a display section 128; and a communicating section 129. The processing section 120 may be constituted in one unit with the current-voltage measurement section 102, otherwise may be located far from the current-voltage measurement section 102, as different unit. The detailed configuration of the processing section 120 is described as follows.

The decoders 121, 122, 123 and 124 reversely convert signals which are converted to the convolutional codes used in Viterbi decoding or Reed-Solomon codes.

Specifically, the decoder 121 receives the code sequence signal from the encoder 116, which concerns the 1-side current A1. The decoder 121 converts the code sequence signal into the information sequence signal with detection and correction of errors in the code sequence signal. The decoder 122 receives the code sequence signal from the encoder 117, which concerns the 3-side current A3. The decoder 122 converts the code sequence signal into the information sequence signal with detection and correction of errors in the code sequence signal. The decoder 123 receives the code sequence signal from the encoder 118, which concerns the 1-side voltage V1. The decoder 123 converts the code sequence signal into the information sequence signal with detection and correction of errors in the code sequence signal. The decoder 124 receives the code sequence signal from the encoder 119, which concerns the 3-side voltage V3. The decoder 124 converts the code sequence signal into the information sequence signal with detection and correction of errors in the code sequence signal.

The power calculating section 125 includes a digital multiplier circuit, a digital signal processor (DSP), and the like. The power calculating section 125 executes the following processes: multiplying the information sequence signal concerning the 1-side current A1 with the information sequence signal concerning the 1-side voltage V1; multiplying the information sequence signal concerning the 3-side current A3 with the information sequence signal concerning the 3-side voltage V3; calculating a sum of the two values obtained by multiplication as described above; and converting the sum into digital data (i.e. corresponding to a value of A1·V1+ A3·V3) which is directly proportional to electricity consumption by the customer; and outputting the digital data.

The controller 126 has a microcomputer or the like, which generates and stores the consumption data with use of the digital data (corresponding to the value of A1·V1+A3·V3) output from the power calculating section 125, and which controls display of the consumption data.

The memory 127 is a semiconductor memory such as RAM, and stores the consumption data.

The display section 128 includes a display such as LCD (liquid crystal display) or the like. The display section 128 displays the consumption data under control of the controller 126.

The communicating section 129 includes interface circuits such as a radiowave transmission and reception circuit, a current loop or the like. The communication section 129 communicates with the outside under control of the controller 126.

Next, an operation of the embodiment is explained with reference to FIG. 1. The current-voltage measurement section 102 may be constituted in one unit with the processing section 120, otherwise may be located far from the processing section 120, as different unit The current detector 103 detects and converts the 1-side current A1 into a low-level voltage signal which is directly proportional to the 1-side current A1 used by the customer, and outputs the low-level voltage signal. The current detector 103 always outputs the low-level voltage signals concerning the 1-side current A1 to the modulator 107.

The voltage detector 105 detects and converts the 1-side voltage V1 into a low-level voltage signal which is directly proportional to the 1-side voltage V1 used by the customer, and outputs the low-level voltage signal. The voltage detector 105 always outputs the low-level voltage signals concerning the 1-side voltage V1 to the modulator 109.

The modulator 107 modulates the low-level voltage signal output from the current detector 103 by the delta-sigma modulation, and outputs the modulated voltage signal as 1-bit digital data. The delta-sigma modulation is performed at predetermined periods (e.g. every 1 micro seconds), based on the timing signal from the timing circuit 111. Note, the modulator 107 may perform the delta modulation or pulse-width modulation.

The modulator 109 modulates the low-level voltage signal output from the voltage detector 105 by the delta-sigma modulation, and outputs the modulated voltage signal as 1-bit digital data. The delta-sigma modulation is performed at predetermined periods (e.g. every 1 micro seconds), based on the timing signal from the timing circuit 111. Note, the modulator 109 may perform the delta modulation or pulse-width modulation.

The digitizing section 112 produces digital data with multiple bits (e.g. 16-bit digital data) concerning the 1-side current A1 based on the 1-bit digital data output from the modulator 107.

The digitizing section 114 produces digital data with multiple bits (e.g. 16-bit digital data) concerning the 1-side voltage V1 based on the 1-bit digital data output from the modulator 109.

The encoder 116 converts the information sequence signal, which is the digital data concerning the 1-side current A1 and is output from the digitizing section 112, into code sequence signal using Reed-Solomon codes or convolutional codes used in Viterbi decoding or the like. Thereafter, the encoder 116 outputs the information sequence signal to the decoder 121. The signal transmission between the encoder 116 and decoder 121 is achieved by any of a wire on a printed circuit board, twisted-pair cable, optical cable, optical transmission, wireless communication, electromagnetic induction and the like.

The encoder 118 converts the information sequence signal, which is the digital data concerning the 1-side voltage V1 and is output from the digitizing section 114, into code sequence signal using Reed-Solomon codes or convolutional codes used in Viterbi decoding or the like. Thereafter, the encoder 118 outputs the information sequence signal to the decoder 123. The signal transmission between the encoder 118 and decoder 123 is achieved by any of a wire on a printed circuit board, twisted-pair cable, optical cable, optical transmission, wireless communication, electromagnetic induction and the like.

The decoder 121 receives the code sequence signal sent from the encoder 116, which concerns the 1-side current A1, and detects errors therein. When it is determined in the error detection that the code sequence signal has errors which does not exceed an error correction capacity of the decoder 121, the decoder 121 reversely converts the code sequence signal into an information sequence signal with correction of the code sequence in the code sequence signal, and outputs the information sequence signal to the power calculating section 125. When it is determined in the error detection that the code sequence signal has errors which exceed the error correction capacity of the decoder 121, the decoder 121 requests the encoder 116 to resend the code sequence signal. The decoder 121 receives the code sequence signal again, reversely converts the code sequence signal into information sequence signal with correction of the code sequence in the code sequence signal, and outputs the information sequence signal to the power calculating section 125.

When it is determined that the code sequence signal has errors which exceed the error correction capacity of the decoder 121, the decoder 121 may be set neither to request the encoder 116 to resend the code sequence signal, nor to reversely convert the code sequence signal into the information sequence signal. Alternatively, when it is determined that the code sequence signal has errors which does not exceed the error correction capacity of the decoder 121 and the code sequence signal has the errors which exceeds a predetermined threshold value, the decoder 121 may be set not to reversely convert the code sequence signal into the information sequence signal.

When the decoder 121 does not reversely convert the code sequence signal to the information sequence signal, the decoder 121 outputs a signal to the power calculating section 125, the signal indicating that the decoder 121 does not send the information sequence signal to the power calculating section 125. In this case, the power calculating section 125 compensates the lack of the information sequence signal, for example, by calculation of the average value of the information signals before and after the reception of the signal indicating that the decoder 121 does not send the information sequence signal to the power calculating section 125.

The decoder 123 receives the code sequence signal sent from the encoder 118, which concerns the 1-side voltage V1, and detects errors therein. When it is determined in the error detection that the code sequence signal has errors which does not exceed an error correction capacity of the decoder 123, the decoder 123 reversely converts the code sequence signal into an information sequence signal with correction of the code sequence in the code sequence signal, and outputs the information sequence signal to the power calculating section 125. When it is determined in the error detection that the code sequence signal has errors which exceed the error correction capacity of the decoder 123, the decoder 123 requests the encoder 118 to resend the code sequence signal. The decoder 123 receives the code sequence signal again, reversely converts the code sequence signal into information sequence signal with correction of the code sequence in the code sequence signal, and outputs the information sequence signal to the power calculating section 125.

When it is determined that the code sequence signal has errors which exceed the error correction capacity of the decoder 123, the decoder 123 may be set neither to request the encoder 118 to resend the code sequence signal, nor to reversely convert the code sequence signal into the information sequence signal. Alternatively, when it is determined that the code sequence signal has errors which does not exceed the error correction capacity of the decoder 123 and the code sequence signal has errors which exceeds a predetermined threshold value, the decoder 123 may be set not to reversely convert the code sequence signal into the information sequence signal.

When the decoder 123 does not reversely convert the code sequence signal to the information sequence signal, the decoder 123 outputs a signal to the power calculating section 125, the signal indicating that the decoder 123 does not send the information sequence signal to the power calculating section 125. In this case, the power calculating section 125 compensates the lack of the information sequence signal, for example, by calculation of the average value of the information signals before and after the reception of the signal indicating that the decoder 123 does not send the information sequence signal to the power calculating section 125.

The current detector 104 detects the 3-side current A3, converts to a low-level voltage signal which is directly proportional to the detected current, and outputs the low-level voltage signal. The current detector 104 always outputs the low-level voltage signals concerning the 3-side current A3 to the modulator 108.

The voltage detector 106 detects the 3-side voltage V3, converts to a low-level voltage signal which is directly proportional to the detected voltage, and outputs the low-level voltage signal. The voltage detector 106 always outputs the low-level voltage signals concerning the 3-side voltage V3 to the modulator 110.

The modulator 108 modulates the low-level voltage signal output from the current detector 104 by the delta-sigma modulation, and outputs the modulated voltage signal as 1-bit digital data. The delta-sigma modulation is performed at predetermined periods (e.g. every 1 micro seconds), based on the timing signal from the timing circuit 111. Note, the modulator 108 may perform the delta modulation or pulse-width modulation.

The modulator 110 modulates the low-level voltage signal output from the voltage detector 106 by the delta-sigma modulation, and outputs the modulated voltage signal as 1-bit digital data. The delta-sigma modulation is performed at predetermined periods (e.g. every 1 micro seconds), based on the timing signal from the timing circuit 111. Note, the modulator 110 may perform the delta modulation or pulse-width modulation.

The digitizing section 113 produces digital data with multiple bits (e.g. 16-bit digital data) concerning the 3-side current A3 based on the 1-bit digital data output from the modulator 108.

The digitizing section 115 produces digital data with multiple bits (e.g. 16-bit digital data) concerning the 3-side voltage V3 based on the 1-bit digital data output from the modulator 110.

The encoder 117 converts information sequence signal, which is the digital data concerning the 3-side current A3 and is output from the digitizing section 112, into code sequence signal using Reed-Solomon codes or convolutional codes used in Viterbi decoding or the like. Thereafter, the encoder 117 outputs the information sequence signal to the decoder 122. The signal transmission between the encoder 117 and decoder 122 is achieved by any of a wire on a printed circuit board, twisted-pair cable, optical cable, optical transmission, wireless communication, electromagnetic induction and the like.

The encoder 119 converts information sequence signal, which is the digital data concerning the 3-side voltage V3 and is output from the digitizing section 115, into code sequence signal using Reed-Solomon codes or convolutional codes used in Viterbi decoding or the like. Thereafter, the encoder 119 outputs the information sequence signal to the decoder 124. The signal transmission between the encoder 119 and decoder 124 is achieved by any of a wire on a printed circuit board, twisted-pair cable, optical cable, optical transmission, wireless communication, electromagnetic induction and the like.

The decoder 122 receives the code sequence signal sent from the encoder 117, which concerns the 3-side current A3, and detects errors therein. When it is determined in the error detection that the code sequence signal has errors which does not exceed an error correction capacity of the decoder 122, the decoder 122 reversely converts the code sequence signal into an information sequence signal with correction of the code sequence in the code sequence signal, and outputs the information sequence signal to the power calculating section 125. When it is determined in the error detection that the code sequence signal has errors which exceed the error correction capacity of the decoder 122, the decoder 122 requests the encoder 117 to resend the code sequence signal. The decoder 122 receives the code sequence signal again, reversely converts the code sequence signal into information sequence signal with correction of the code sequence in the code sequence signal, and outputs the information sequence signal to the power calculating section 125.

When it is determined that the code sequence signal has errors which exceed the error correction capacity of the decoder 122, the decoder 122 may be set neither to request the encoder 117 to resend the code sequence signal, nor to reversely convert the code sequence signal into the information sequence signal. Alternatively, when it is determined that the code sequence signal has errors which does not exceed the error correction capacity of the decoder 122 and the code sequence signal has errors which exceeds a predetermined threshold value, the decoder 122 may be set not to reversely convert the code sequence signal into the information sequence signal.

When the decoder 122 does not reversely convert the code sequence signal to the information sequence signal, the decoder 122 outputs a signal to the power calculating section 125, the signal indicating that the decoder 122 does not send the information sequence signal to the power calculating section 125. In this case, the power calculating section 125 compensates the lack of the information sequence signal, for example, by calculation of the average value of the information signals before and after the reception of the signal indicating that the decoder 122 does not send the information sequence signal to the power calculating section 125.

The decoder 124 receives the code sequence signal sent from the encoder 119, which concerns the 3-side voltage V3, and detects errors therein. When it is determined in the error detection that the code sequence signal has errors which does not exceed an error correction capacity of the decoder 124, the decoder 124 reversely converts the corrected code sequence signal into an information sequence signal with correction of the code sequence in the code sequence signal, and outputs the information sequence signal to the power calculating section 125. When it is determined in the error detection that the code sequence signal has errors which exceed the error correction capacity of the decoder 124, the decoder 124 requests the encoder 119 to resend the code sequence signal. The decoder 124 receives the code sequence signal again, reversely converts the code sequence signal into information sequence signal with correction of the code sequence in the code sequence signal, and outputs the information sequence signal to the power calculating section 125.

When it is determined that the code sequence signal has errors which exceed the error correction capacity of the decoder 124, the decoder 124 may be set neither to request the encoder 119 to resend the code sequence signal, nor to reversely convert the code sequence signal into the information sequence signal. Alternatively, when it is determined that the code sequence signal has errors which does not exceed the error correction capacity of the decoder 124 and the code sequence signal has errors which exceeds a predetermined threshold value, the decoder 124 may be set not to reversely convert the code sequence signal into the information sequence signal.

When the decoder 124 does not reversely convert the code sequence signal to the information sequence signal, the decoder 124 outputs a signal to the power calculating section 125, the signal indicating that the decoder 124 does not send the information sequence signal to the power calculating section 125. In this case, the power calculating section 125 compensates the lack of the information sequence signal, for example, by calculation of the average value of the information signals before and after the reception of the signal indicating that the decoder 124 does not send the information sequence signal to the power calculating section 125.

The power calculating section 125 executes the following processes: multiplying the information sequence signal concerning the 1-side current A1 with the information sequence signal concerning the 1-side voltage V1; multiplying the information sequence signal concerning the 3-side current A3 with the information sequence signal concerning the 3-side voltage V3; calculating a sum of the two values obtained by multiplication as described above; and converting the sum into digital data (i.e. corresponding to a value of A1·V1+ A3·V3) which is directly proportional to electricity consumption by the customer; and outputting the digital data.

The controller 126 receives the digital data (corresponding to the value of A1·V1+A3·V3) output from the power calculating section 125, and calculates the consumption data. As described above, the consumption data means data concerning electricity consumption by the customer such as electricity consumption in different hours, total electricity consumption in loads, and the like. The controller 126 stores the consumption data in the memory 127 and displays the consumption data to the display 128.

In addition, the controller 126 always monitors the signal reception of decoders 121, 122, 123 and 124 from the encoders 116, 117, 118 and 119. When at least one of the decoders 121, 122, 123 and 124 does not receive the signal during a predetermined period, the controller 126 determines that failure has occurred in the current-voltage measurement section 102, stores the time and date of the failure occurrence to the memory 127, and displays the failure to the display 128.

Further, the controller 126 stores information data of the watt-hour meter such as the production and control numbers thereof and the like, the information data being transmitted from an external device. On the other hand, the information data is displayed in the display 128 and is sent to the external device via the communicating section 129, when the sending request of the information data is received by communication from the external device, or a switch (not shown) provided in the watt-hour meter.

The communicating section 129 communicates with the external device under control of the controller 126. The communicating section 129 sends the information data concerning the consumption data, failure data, production number, control number, and the like, by reception of requests from the external device. In addition, the communication section 129 receives the production and control numbers, or the like.

Under control of the controller 126, the memory 127 stores the information data concerning the consumption data, failure data, production number of the watt-hour meter, control number thereof, and the like. Note, the production number may be sent by the communication from the external device in the shipment or the like, and the control number may be sent in the installation to homes or the like. The controller 126 receives these numbers via the communicating section 129 and stores them to the memory 127.

The display 128 is controlled by the controller 126. The display 128 displays the information data concerning the consumption data, failure data, production number of the watt-hour meter, control number thereof, and the like.

According to the embodiment of the present invention, even when external noises interferes the transmission paths between the current-voltage measurement section 102 and processing section 120, errors in transmitted signals from the encoders 116, 117, 118 and 119 are corrected in the decoding by the decoders 121, 122, 123 and 124, thereby reducing errors in the consumption data.

In the embodiment with the following operation: the decoder requests the encoder to resend the code sequence signal when the previously-sent code sequence signal is determined to have errors exceeding the error correction capacity of the decoder, the decoder receives the code sequence signal again, corrects the code sequence signal, reversely converts to the information sequence signal, and outputs the information sequence signal to the power calculating section. Therefore, errors in the consumption data can be reduced in the calculation by the controller.

In the embodiment performing the following operations when it is determined that the code sequence has the errors exceeding the error correction capacity of the decoder: (a) the decoder does not request the encoder to resend the code sequence signal, (b) instead of reverse conversion of the code sequence signal into the information sequence signal, the decoder outputs the signal indicating that the decoder does not send the information sequence signal to the power calculating section, and (c) the power calculating section compensates the lack of the information sequence signal; the information sequence signals including the compensated one are successively sent to the controller without delay thereof. Therefore, errors in the consumption data can be reduced in the calculation by the controller. If the reverse conversion were wrongly performed for the code sequence signal having errors due to burst errors caused in the transmission paths, anomalous values would be calculated. However, in this embodiment, the decoder does not reversely convert such code sequence signals, thus errors in the consumption data can be reduced in the calculation by the controller.

As described above, the present invention can provide watt-hour meters which can reduce measurement errors in the integrated electricity consumption even when the external noises or the like interfere the transmission paths.

Second Embodiment

Figure 4:
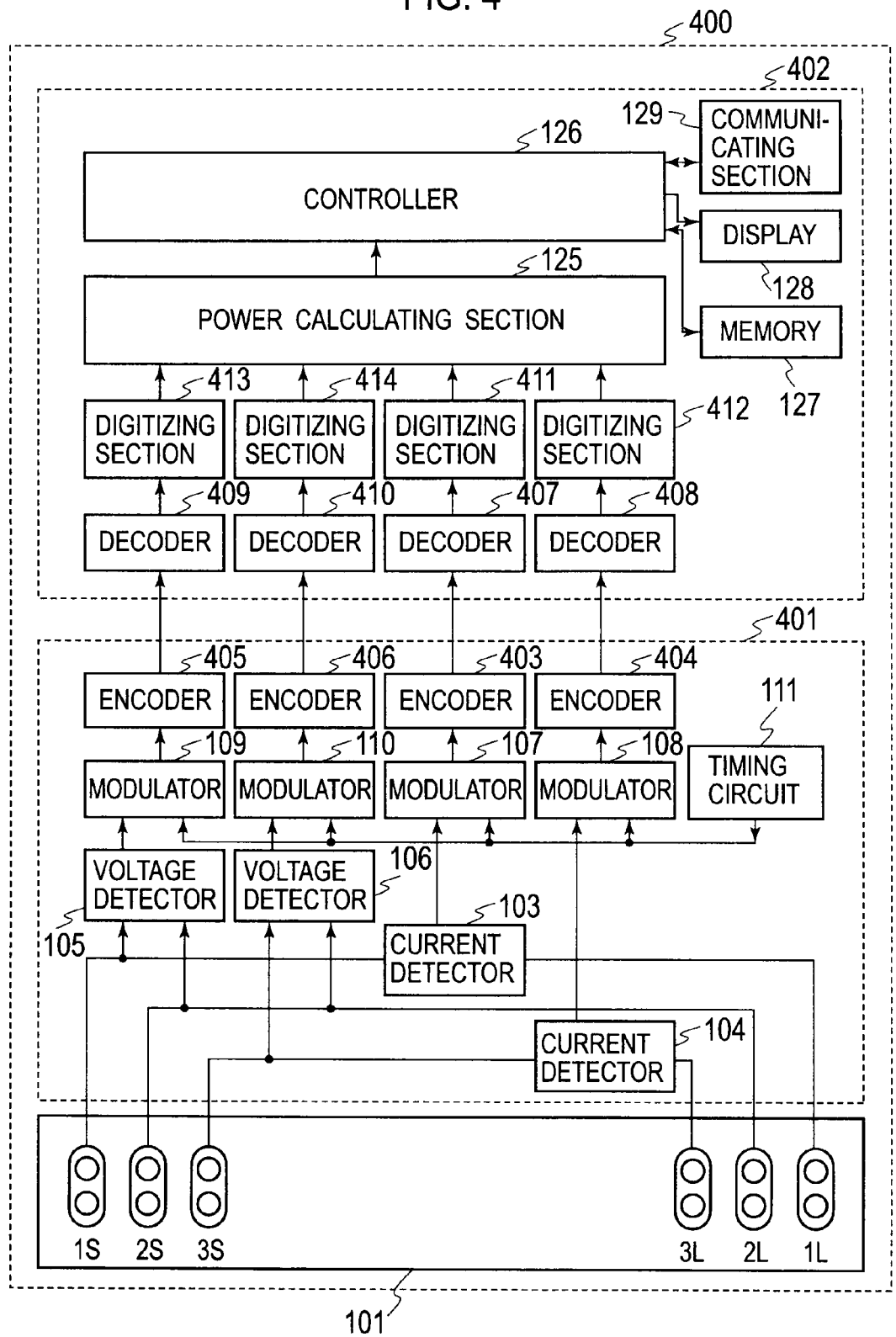
FIG. 4 is a block diagram of a watt-hour meter according to a second embodiment of the present invention.

A second embodiment according to the present invention is explained with reference to FIG. 4. Note, same parts of the second embodiment as those of the first embodiment shown in FIG. 1 are indicated by the same reference numbers.

A watt-hour meter main unit 400 of the second embodiment has: the terminal section 101; a current-voltage measurement section 401 and a processing section 402.

The current-voltage measurement section 401 has: the current detectors 103, 104; the voltage detectors 105, 106; the modulators 107, 108, 109, and 110; the timing circuit 111; and encoders 403, 404, 405, and 406. The current-voltage measurement section 401 measures current and voltage consumed by the customer, and outputs signals concerning the measured current and voltage.

The processing section 402 has: encoders 407, 408, 409, and 410; digitizing sections 411, 412, 413 and 414; the power calculating section 125; the controller 126; the memory 127; the display 128; and the communicating section 129. The processing section 402 calculates consumption data of the customer, and outputs the consumption data by displaying or the like.

The processing section 402 may be constituted in one unit with the current-voltage measurement section 401, otherwise may be located far from current-voltage measurement section 401, as different unit.

The second embodiment has differences from the first embodiment, as described below.

In the first embodiment, the encoder 116, 117, 118 and 119 are provided in the post stage of the digitizing sections 112, 113, 114 and 115. The information sequence signals digitized as the digital data (e.g. 16-bit digital data) are converted by the encoders into the code sequence signals. The code sequence signals are output to the decoders 121, 122, 123 and 124. In the decoders 121, 122, 123 and 124, the code sequence signals are converted into the information sequence signals.

Alternatively, in the second embodiment, the encoders 403, 404, 405 and 406 are provided in the post stage of the modulators 107, 108, 109 and 110. 1-bit data signals converted as code sequence signals by the encoders are output to the decoders 407, 408, 409 and 410. In the decoders 407, 408, 409 and 410, the code sequence signals are reversely converted into information sequence signals. Thereafter, the information sequence signals are digitized by digitizing section 411, 412, 413 and 414.

The encoders 403, 404, 405 and 406 respectively convert the digital data (e.g. 1-bit digital data) output from the modulators 107, 108, 109 and 110 into Reed-Solomon codes or convolutional codes used in Viterbi decoding or the like.

Specifically, the encoder 403 receives the information sequence signal from the modulator 107, which is the digital data concerning the 1-side current A1 (i.e. the current flowing between the terminal 1S and the terminal 1L). The encoder 403 converts the information sequence signal concerning the 1-side current A1 into 1-bit digital data as the code sequence signal, and outputs the code sequence signal to the decoder 407.

The encoder 404 receives the information sequence signal from the modulator 108, which is the digital data concerning the 3-side current A3 (i.e. the current flowing between the terminal 3S and the terminal 3L). The encoder 404 converts the information sequence signal concerning the 3-side current A3 into 1-bit digital data as a code sequence signal, and outputs the code sequence signal to the decoder 408.

The encoder 405 receives the information sequence signal from the modulator 109, which is the digital data concerning the 1-side voltage V1 (i.e. the voltage between the terminal 1S and the terminal 2S). The encoder 405 converts the information sequence signal concerning the 1-side voltage V1 into 1-bit digital data as a code sequence signal, and outputs the code sequence signal to the decoder 409.

The encoder 406 receives the information sequence signal from the modulator 110, which is the digital data concerning the 3-side voltage V3 (i.e. the voltage between the terminal 3S and the terminal 2S). The encoder 406 converts the information sequence signal concerning the 3-side voltage V3 into code sequence signal, and outputs the code sequence signal to the decoder 410.

The decoder 407 receives the code sequence signal from the encoder 403, reversely converts the code sequence signal into information sequence signal concerning the 1-side current A1 with correction of the code sequence in the code sequence signal, and outputs the information sequence signal to the digitizing section 411.

The decoder 408 receives the code sequence signal from the encoder 404, reversely converts the code sequence signal into information sequence signal concerning the 3-side current A3 with correction of the code sequence in the code sequence signal, and outputs the information sequence signal to the digitizing section 412.

The decoder 409 receives the code sequence signal from the encoder 405, reversely converts the code sequence signal into information sequence signal concerning the 1-side voltage V1 with correction of the code sequence in the code sequence signal, and outputs the information sequence signal to the digitizing section 413.

The decoder 410 receives the code sequence signal from the encoder 406, reversely converts the code sequence signal into information sequence signal concerning the 3-side voltage V3 with correction of the code sequence in the code sequence signal, and outputs the information sequence signal to the digitizing section 414.

Note, the signal transmissions between the encoders 403, 404, 405, 406 and decoders 407, 408, 409 and 410, respectively, are achieved by any of a wire on a printed circuit board, twisted-pair cable, optical cable, optical transmission, wireless communication, electromagnetic induction and the like.

The digitizing section 411 produces digital data with multiple bits (e.g. 16-bit digital data) concerning the 1-side current A1 based on the 1-bit digital data output from the decoder 407.

The digitizing section 412 produces digital data with multiple bits (e.g. 16-bit digital data) concerning the 1-side voltage V1 based on the 1-bit digital data output from the decoder 408.

The digitizing section 413 produces digital data with multiple bits (e.g. 16-bit digital data) concerning the 3-side current A3 based on the 1-bit digital data output from the decoder 409.

The digitizing section 414 produces digital data with multiple bits (e.g. 16-bit digital data) concerning the 3-side voltage V3 based on the 1-bit digital data output from the decoder 410.

As described in the first embodiment, the power calculating section 125 generates digital data (i.e. corresponding to a value of A1·V1+A3·V3) which is directly proportional to electricity consumption by the customer; and outputs the digital data to the controller 126.

According to the second embodiment, even when external noises or the like interfere the transmission paths between the current-voltage measurement section 401 and processing section 402, errors in the transmitted signals from the encoders 402, 403, 404 and 405 are corrected in decoding by the decoders 407, 408, 409 and 410, thereby reducing errors in the consumption data to be calculated in the controller 126.

In addition, the encoders 402, 403, 404 and 405 convert the 1-bit data output from the modulators 107, 108, 109 and 110 into the code sequence signals. Thus, the volume of the data from the encoders can be reduced, and the configuration of the encoders can be simplified.

As described above, the present invention can provide watt-hour meters which can reduce measurement errors in the integrated electricity consumption even when the external noises or the like interfere the transmission paths.

Third Embodiment

A third embodiment according to the present invention is explained with reference to FIG. 5. Note, same parts of the third embodiment as those of the first embodiment shown in FIG. 1 are indicated by the same reference numbers.

The third embodiment has differences from the first embodiment, as described below.

In the first embodiment, the encoders 116, 117, 118 and 119 convert the information sequence signals into the code sequence signals with use of error correction codes, and output the code sequence signals to the encoders 121, 122, 123 and 124. The decoders 121, 122, 123 and 124 reversely convert the code sequence signals into the information signals with detection and correction of the code sequence signals.

Alternatively, in the third embodiment, encryption sections 503, 504, 505 and 506 (described below) encrypt information sequence signals as cryptograph, and output the cryptographs to decryption sections 507, 508, 509 and 510 (described below). The decryption sections reversely convert the cryptographs into the information sequence signals with detection and correction of the cryptographs.

Figure 5:
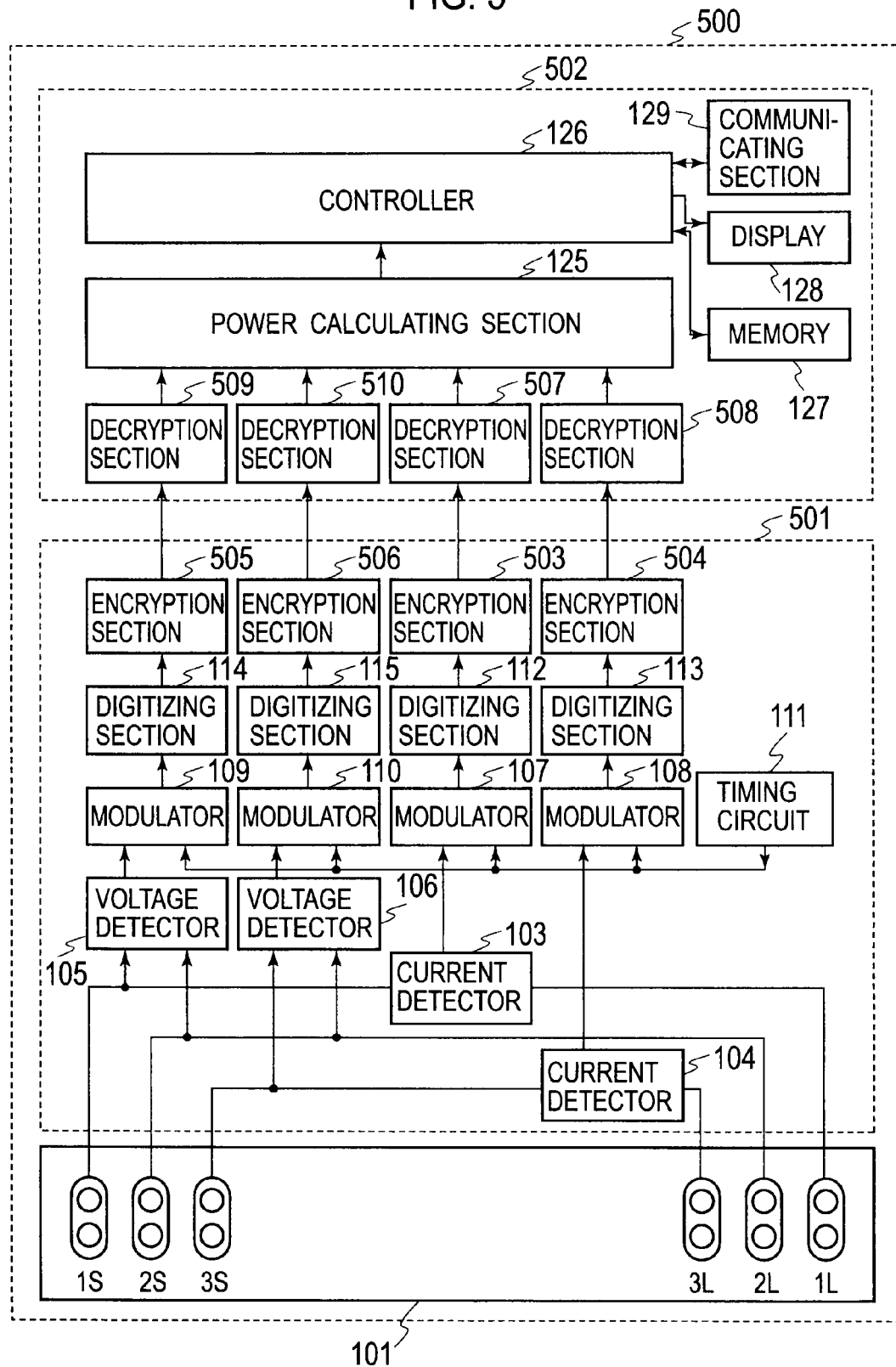
FIG. 5 is a block diagram of a watt-hour meter according to a third embodiment of the present invention.

As shown in FIG. 5, a watt-hour meter main unit 500 of the third embodiment has the terminal section 101, a current-voltage measurement section 501 and a processing section 502.

The current-voltage measurement section 501 has: the current detectors 103, 104; the voltage detectors 105, 106; the modulators 107, 108, 109 and 110; the timing circuit 111; the digitizing section 112, 113, 114 and 115; and the encryption sections 503, 504, 505 and 506. The current-voltage measurement section 501 measures current and voltage consumed by the customer, and outputs signals concerning the measured current and voltage.

The processing section 502 has: the decryption sections 507, 508, 509 and 510; the power calculating section 125; the controller 126; the memory 127; the display 128; and communicating section 129. The processing section 502 may be constituted in one unit with the current-voltage measurement section 501, otherwise may be located far from the current-voltage measurement section 501, as different unit.

The encryption section 503 has: an encryption circuit, a coding circuit including an encoder. The encryption circuit encrypts the information sequence signal of the digital data with multiple bits (e.g. 16-bit digital data) by exclusive OR (XOR) on the information sequence signal and a preset key code, the information sequence signal concerning the 1-side current A1 (i.e. the current flowing between the terminal 1S and the terminal 1L) and being output from the digitizing section 112. The coding circuit converts the encrypted information sequence signal into the code sequence signal with Reed-Solomon codes or convolutional codes used in Viterbi decoding or the like. The coding circuit outputs the code sequence signal as cryptograph to the decryption section 507.

The encryption sections 504, 505 and 506 have the same configuration as that of the encryption section 503.

The encryption section 504 encrypts the information sequence signal concerning the 3-side current (i.e. the current flowing between the terminal 3S and the terminal 3L), converts it into the code sequence signal, and outputs the code sequence signal to the decryption section 508.

The encryption section 505 encrypts the information sequence signal concerning the 1-side voltage V1 (i.e. the voltage between the terminal 1S and the terminal 2S), converts it into the code sequence signal, and outputs the code sequence signal to the decryption section 509.

The encryption section 506 encrypts the information sequence signal concerning the 3-side voltage V3 (i.e. the voltage between the terminal 3S and the terminal 2S), converts it into the code sequence signal, and outputs the code sequence signal to the decryption section 510.

The decryption section 507 includes: a decoder configured to reversely convert a signal which is converted into Reed-Solomon codes or convolutional codes used in Viterbi decoding or the like, and decryption circuit configured to decrypt a cryptograph, for example, by exclusive OR (XOR) with a preset key code. The decryption section 507 detects and correct errors in the cryptograph on the 1-side current A1 output from the encryption section 503, reversely converts the cryptograph into the information sequence signal. Thereafter, the decryption section 507 decrypts the information sequence signal with exclusive OR (XOR) on the information sequence signal and a preset key code. Finally, the decryption section 507 outputs the decrypted information sequence signal to the power calculating section 125.

The decryption sections 508, 509 and 510 have the same configuration as that of the decryption section 507. They decrypt cryptographs into the information sequence signals, and output the information sequence signals to the power calculating section 125. The decryption sections 508, 509 and 510 decrypt the cryptographs concerning the 3-side current, 1-side voltage, and 3-side voltage, respectively.

Note, the encryption sections 503, 504, 505 and 506, and decryption sections 507, 508, 509 and 510 may use the common key cryptosystem (symmetric key algorithm) such as data encryption standard (DES), advanced encryption standard (AES), or the like. With the common key cryptosystem, the encryption section and decryption section therefor require no communication on the key code with each other. Accordingly, it is possible to avoid the key code to be stolen and improperly decrypted by tap or the like. Meanwhile, the key code for the encryption and decryption may be stored in the encryption sections 503, 504, 505 and 506, and decryption sections 507, 508, 509 and 510 in the production thereof.

Meanwhile, a plurality of key codes may be stored in the encryption sections 503, 504, 505 and 506, and decryption sections 507, 508, 509 and 510. In this case, for example, the key codes may be selectively used depending on the predetermined hours.

According to the third embodiment, even when external noises or the like interfere the transmission paths between the current-voltage measurement section 501 and processing section 502, errors in transmitted signals from the encryption sections 503, 504, 505 and 506 are corrected in decrypting by the decryption sections 507, 508, 509 and 510, thereby reducing errors in the consumption data to be calculated in the controller 126.

In addition, the communication signals between the current-voltage measurement section 501 and processing section 502 is encrypted. Therefore, it is difficult for third parties to decrypt the encrypted communication signals which is tapped. Further, the encrypted communication signals have the data structures that are hardly estimated for the third parties. Therefore, even when the third parties input improper signals from the outside to the processing section 502 for abusive reduction of the power charge, misconducts such as falsification of the consumption data or the like can be prevented because the input signals is determined as improper communication signals due to different data structures from that of the proper communication signals. Accordingly, the reliability of the consumption data calculated in the watt-hour meter is improved.

As described above, the present invention can provide watt-hour meters which can reduce measurement errors in the integrated electricity consumption even when the external noises or the like interfere the transmission paths.

Fourth Embodiment

A fourth embodiment according to the present invention is explained with reference to FIG. 6. Note, same parts of the fourth embodiment as those of the first embodiment shown in FIG. 1 are indicated by the same reference numbers.

The fourth embodiment has differences from the first embodiment, as described below.

In the first embodiment, the encoders 116, 117, 118 and 119 convert the information sequence signals into the code sequence signals with use of error correction codes, and output the code sequence signals to the decoders 121, 122, 123 and 124. The decoders 121, 122, 123 and 124 reversely convert the code sequence signals into the information signals again with detection and correction of the code sequence signals.

Alternatively, in the fourth embodiment, the difference value calculating sections 603, 604, 605 and 606 as described below calculate difference values between presently digitized values obtained in the digitizing sections 112, 113, 114 and 115 and previously digitized values obtained therein. The difference value calculating sections 603, 604, 605 and 606 further convert information sequence signals concerning the difference values into code sequence signals using error correction codes, and output the code sequence signals to the accumulated value calculating sections 607, 608, 609 and 610 as describe below. Thereafter, the accumulated value calculating sections 607, 608, 609 and 610 reversely convert to the information sequence signals concerning the difference values with detection and correction of the code sequence signals. Further, the accumulated value calculating sections 607, 608, 609 and 610 accumulate the difference values calculated in the respective difference value calculating sections 603, 604, 605 and 606 to calculate values obtained in the digitizing sections 112, 113, 114 and 115.

Figure 6:
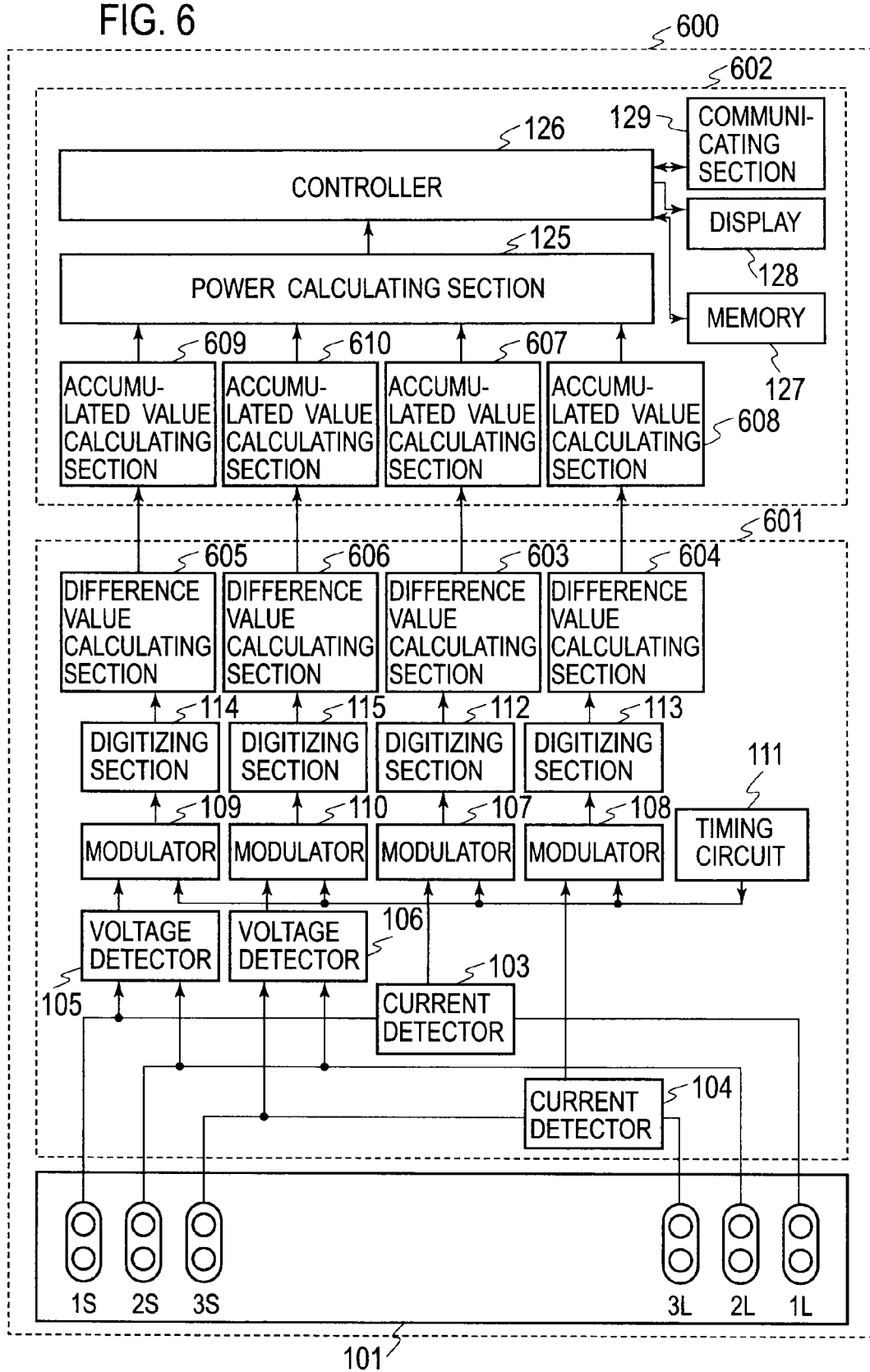
FIG. 6 is a block diagram of a watt-hour meter according to a fourth embodiment of the present invention.

As shown in FIG. 6, a watt-hour meter main unit 600 of the fourth embodiment has the terminal section 101, a current-voltage measurement section 601 and a processing section 602.

The current-voltage measurement section 601 measures the current and voltage consumed by the customer. The current-voltage measurement section 601 has: the current detectors 103, 104; the voltage detectors 105, 106; the modulators 107, 108, 109 and 110; the timing circuit 111; the digitizing sections 112, 113, 114 and 115; and the difference value calculating sections 605, 606, 607 and 608.

The processing section 602 calculates and displays the consumption data concerning the electricity consumption by the customer. The processing section 602 has: the accumulated value calculating sections 607, 608, 609 and 610, the power calculating section 125, the controller 126, the memory 127, the display 128, and the communicating section 129.

The difference value calculating section 603 includes a subtraction circuit, encoder, and the like. The subtraction circuit calculates a difference value between values of digital data (e.g. 16-bit digital data) concerning the 1-side currents A1 (i.e. the current flowing between the terminal 1S and the terminal 1L), which are presently and previously sampled by the digitizing section 112. The encoder converts the information sequence signal concerning the difference value into the code sequence signal using Reed-Solomon codes or convolutional codes used in Viterbi decoding or the like. The difference value calculating section 603 includes a memory (not shown) therein to store the digital data concerning the 1-side current A1 previously sampled by the digitizing section 112. The subtraction circuit subtracts the stored digital data obtained in the previous sampling from the digital data obtained in the present sampling to produce the difference value as the information sequence signal. The decoder converts this information sequence signal concerning the difference value into the code sequence signal using Reed-Solomon codes or convolutional codes used in Viterbi decoding or the like. The encoder outputs the code sequence signal to the accumulated value calculating section 607.

The difference value calculating sections 604, 605 and 606 have the same configuration as that of the difference value calculating section 603. The difference value calculating sections 604, 605 and 606 convert information sequence signals of difference value concerning the 3-side current A3 (i.e. the current flowing between the terminal 3S and the terminal 3L), 1-side voltage V1 (i.e. the voltage between the terminal 1S and the terminal 2S), and 3-side voltage V3 (i.e. the voltage between the terminal 3S and the terminal 2S), respectively; and output code sequence signals corresponding thereto to the accumulated value calculating sections 608, 609 and 610, respectively.

The accumulated value calculating section 607 includes: a decoder configured to reversely convert a signal which is converted into Reed-Solomon codes or convolutional codes used in Viterbi decoding or the like; and an adder configured to add the presently-received difference value to an accumulated value of the previously received difference values. The accumulated value calculating section 607 receives the code sequence signal of the difference value concerning the 1-side current from the difference value calculating section 603. The accumulated value calculating section 607 reversely converts this code sequence signal into the information sequence signal of the difference value with detection and correction of errors in the code sequence signal. Thereafter, the accumulated value calculating section 607 adds the present difference value to the accumulated value of the previously received difference values, thereby restoring the numeric data obtained in the digitizing section 112. The numeric data is output to the power calculating section 125.

The accumulated value calculating sections 608, 609 and 610 have the same configuration as that of the accumulated value calculating section 607. In the accumulated value calculating section 608, the code sequence signal of the difference value concerning the 3-side current is restored to the numeric data obtained in the digitizing section 113, and the numeric data is output to the power calculating section 125. In the accumulated value calculating section 609, the code sequence signal of the difference value concerning the 1-side voltage is restored to the numeric data obtained in the digitizing section 114, and the numeric data is output to the power calculating section 125. In the accumulated value calculating section 610, the code sequence signal of the difference value concerning the 3-side voltage is restored to the numeric data obtained in the digitizing section 115, and the numeric data is output to the power calculating section 125.

According to the fourth embodiment, errors in the signals sent from the difference value calculating sections 603, 604, 605 and 606 are corrected in decoding by the accumulated value calculating sections 607, 608, 609 and 610 even when external noises or the like interfere the transmission paths between the current-voltage measurement section 601 and processing section 602. Accordingly, errors in the consumption data are reduced in the calculation by the controller 126.

Since only difference value of the numeric data obtained in the digitizing sections 112, 113, 114 and 115 is sent from the difference value calculating sections 603, 604, 605 and 606 to the accumulated value calculating sections 607, 608, 609 and 610, the volume of the data to be communicated therebetween can be reduced.

In addition, the volume of the data to be communicated is reduce, thus the electricity consumption in the watt-hour meter can be reduced.

As described above, the present invention can provide watt-hour meters which can reduce measurement errors in the integrated electricity consumption even when the external noises or the like interfere the transmission paths.

What is claimed is:

1. A watt-hour meter comprising:
   a detector configured to detect a current flowing to a load and to detect a voltage applied in the load;
   a digitizing section configured to convert the detected current and voltage into numeric data thereof as an information sequence signal;
   an encoder configured to convert the information sequence signal into a code sequence signal including an error correction code;
   a decoder configured to reversely convert the code sequence signal into the information sequence signal with correction and detection of an error in the code sequence signal; and
   a power calculating section configured to calculate a data concerning an electricity consumption from the information sequence signal reversely converted by the decoder;
   wherein the encoder generates a signal encoded by a first key code, and the decoder generates a signal decoded by a second key code corresponding to the first key code; and
   wherein the first and second key codes are selected from a plurality of predetermined key codes depending on hours of electricity consumption.

2. The watt-hour meter according to claim 1, wherein the encoder produces a convolutional code.

3. The watt-hour meter according to claim 1, wherein the encoder produces a Reed-Solomon code.

4. The watt-hour meter according to claim 1, wherein the decoder requests the encoder to resend the code sequence signal when the code sequence signal has errors, and the encoder resends the code sequence signal again when the encoder receives the resending request by the decoder.

5. The watt-hour meter according to claim 1, wherein the decoder outputs a signal indicating that the decoder does not send the information sequence signal when the code sequence signal has errors which exceed the error correction capacity of the decoder.

6. A watt-hour meter comprising:
   a detector configured to detect a current flowing to a load and to detect a voltage applied in the load;
   a modulator configured to modulate the detected current and voltage into 1-bit digital data as an information sequence signal;
   an encoder configured to convert the information sequence signal into a code sequence signal with an error correction code;
   a decoder configured to reversely convert the code sequence signal into 1-bit digital data as the information sequence signal with correction and detection of an error in the code sequence signal;
   a digitizing section configured to convert the 1-bit digital data reversely converted by the decoder into numeric data with multiple bits, the numeric data concerning the current and voltage; and
   a power calculating section configured to calculate a data concerning an electricity consumption from the numeric data obtained by the digitizing section;
   wherein the encoder generates a signal encoded by a first key code, and the decoder generates a signal decoded by a second key code corresponding to the first key code; and
   wherein the first and second key codes are selected from a plurality of predetermined key codes depending on hours of electricity consumption.

7. The watt-hour meter according to claim 6, wherein the encoder produces a convolutional code.

8. The watt-hour meter according to claim 6, wherein the encoder produces a Reed-Solomon code.

9. The watt-hour meter according to claim 6, wherein the decoder requests the encoder to resend the code sequence signal when the code sequence signal has errors, and the encoder resends the code sequence signal again when the encoder receives the resending request by the decoder.

10. The watt-hour meter according to claim 6, wherein the decoder outputs a signal indicating that the decoder does not send the information sequence signal when the code sequence signal has errors which exceed the error correction capacity of the decoder.

* * * * *